United States Patent
Kushiya et al.

[11] Patent Number: 6,040,521
[45] Date of Patent: Mar. 21, 2000

[54] N-TYPE WINDOW LAYER FOR A THIN FILM SOLAR CELL AND METHOD OF MAKING

[75] Inventors: Katsumi Kushiya; Daisuke Okumura; Ichiro Sugiyama, all of Tokyo, Japan

[73] Assignee: Showa Shell Sekiyu K.K., Tokyo, Japan

[21] Appl. No.: 08/854,092

[22] Filed: May 9, 1997

[30] Foreign Application Priority Data

Nov. 8, 1996 [JP] Japan .................................. 8-311182

[51] Int. Cl.$^7$ ...................... H01L 31/032; H01L 31/0272
[52] U.S. Cl. .......................... 136/265; 136/262; 136/264; 136/252; 438/85; 438/95; 204/192.29
[58] Field of Search .................................. 136/257, 265, 136/252, 255; 438/85, 95; 204/192.29

[56] References Cited

U.S. PATENT DOCUMENTS

| | | | |
|---|---|---|---|
| 4,611,091 | 9/1986 | Choudary et al. ...................... | 136/260 |
| 4,612,411 | 9/1986 | Wieting et al. ......................... | 136/265 |
| 4,798,660 | 1/1989 | Ermer et al. ....................... | 204/192.17 |
| 4,915,745 | 4/1990 | Pollock et al. ........................... | 136/265 |
| 5,078,804 | 1/1992 | Chen et al. .............................. | 136/260 |
| 5,436,204 | 7/1995 | Albin et al. .............................. | 437/225 |
| 5,474,939 | 12/1995 | Pollock et al. .............................. | 437/5 |
| B1 4,915,745 | 4/1992 | Pollock et al. ........................... | 136/265 |

OTHER PUBLICATIONS

M. A. Contreras, et al., "High Efficiency Cu(IN, Ga)Se$_2$–Based Solar Cells: Processing of Novel Absorber Structures", World Conference on Photovoltaic Energy, Waikoloa, Dec. 5–9, 1994, vol. 1, No. Conf. 1, Dec. 5, 1994, pp. 68–75, Institute of Electrical and Electronics Engineers.

J. Kessler, et al; Front Contact Optimization for Cu(In, Ga)Se$_2$ (SUB)Modules 25th PVSC; May 13–17, 1996; Wash., D.C.; pp. 885–888.

K. Ellmer, et al; ZnO/ZnO:Al Window and Contact Layer for Thin Film Solar Cells: High Rate Deposition By Simultaneous RF and DC Magnetron Sputtering; 25th PVSC; May 13–17, 1996; Wash., D .C.; pp. 881–884.

M. Ruckh, et al; Applications of ZnO IN Cu(In,Ga)Se$_2$ Solar Cells; 25th PVSC; May 13–17, 1996; Washington, D.C.; pp. 825–828.

Wen S. Chen, et al.; Thin Film CuInGaSe$_2$ Cell Development; 23rd PVSC, 1993; pp. 422–425.

J. Kessler, et al.; Front Contact Optimization for Cu(In, Ga)Se2 (SUB)Modules 25th PVSC; Wash., D.C.; pp. 885–888, May 13, 1996.

Wen S. Chen, et al.; Thin Film CuInGaSe2 Cell Development; 23rd PVSC; pp. 422–425, Dec. 9, 1993.

*Primary Examiner*—Nam Nguyen
*Assistant Examiner*—Michael C. Higgins
*Attorney, Agent, or Firm*—Sughrue, Mion, Zinn, Macpeak & Seas, PLLC

[57] ABSTRACT

Transparent conductive ZnO films are formed at a high rate, are equal in performance to those formed by MOCVD and have a large area, while the influence of sputtering bombardment is reduced. A method for producing transparent conductive ZnO films is used to produce the window layer of a CIGS thin-film solar cell. A first conductive film functioning as an interface-protective film is formed on a high-resistance-buffer (interfacial) layer by low-output (100 W or lower) RF sputtering using a ZnO target while reducing sputtering bombardment. Second and third conductive films for the window layer are then formed by DC magnetron sputtering in steps using a ZnO—Al target in each step.

6 Claims, 4 Drawing Sheets

N-TYPE WINDOW LAYER FOR A THIN FILM SOLAR CELL AND METHOD OF MAKING

FIELD OF THE INVENTION

The present invention relates to transparent conductive films for use as the window layer of a CIGS thin-film solar cell and to a method for producing the transparent conductive films.

BACKGROUND OF THE INVENTION

Transparent conductive films for use as the window layer of a CIGS (copper indium gallium diselenide) thin-film solar cell should have n-type conductivity. The performance characteristics which these transparent conductive films are required to have include the following:

(1) a low resistivity, because of the use thereof as an upper electrode (the sheet resistance thereof is theoretically as low as possible, desirably 10 $\Omega/\square$ or lower);
(2) a high transmittance, because of the function thereof as a window layer through which incident light should pass (the transmittance thereof is desirably 90% or higher (at 800 nm)); and
(3) avoiding impairment of junction characteristics, because the CIGS thin-film solar cell has a stacked structure.

Processes for producing zinc oxide (ZnO) for use as such transparent conductive film include the metal organic chemical vapor deposition method (MOCVD) and sputtering. Features of each method are shown below.

The advantages of MOCVD include the following.
(1) It is possible to form a transparent conductive film having any desired resistivity by regulating the amount of a dopant at low substrate temperature which mutual diffusion of each constituent of a CIGS thin-film solar cell is hard to occur.
(2) Since MOCVD is a technique of depositing a transparent conductive film based on a chemical reaction, a hard zinc oxide (ZnO) film can be deposited under mild conditions without damaging the soft light absorbing layer of a CIGS solar cell.
(3) By regulating its surface roughness, the transparent conductive film can be made to have a surface texture which produces a light trapping effect, and thus is expected to partly function as an antireflection film.

The disadvantages of MOCVD include the following.
(1) It is impossible to independently control the transmittance and the resistivity of a transparent conductive film (the optimal values thereof are a compromise between the two properties).
(2) It is necessary to heat the substrate to accelerate the chemical reaction, and the resulting thermal stress causes the substrate to suffer elastic deformation, which in turn is apt to cause troubles including film peeling and generation of defects.
(3) A layer having high resistance deposits in the initial stage of the formation of a transparent conductive film of zinc oxide (ZnO), so that the film finally obtained cannot have low resistance throughout the whole thickness.
(4) Since the deposition of a transparent conductive film is based on a chemical reaction, the film production requires a significant amount of time (for instance, the deposition of a ZnO film with a thickness of 2 $\mu$m requires about 1 hour depending on the size of apparatus for this purpose).
(5) Since the production equipment includes a batch reactor, the method has poor production efficiency in industrial production.
(6) In producing a large-area thin-film solar cell, it is difficult to attain good reproducibility in regard to evenness of substrate temperature and evenness of feedstock gas flow.

Conventional methods of sputtering for forming a transparent conductive film include RF sputtering and DC sputtering. Specifically, a transparent conductive ZnO film has been formed by RF or DC sputtering on a heated substrate in one step using an argon gas or $O_2/Ar$ mixed gas as a sputtering gas and using a ZnO—Al target or the like as the only target.

Few examples have been reported on the fabrication of a CIGS thin-film solar cell using DC sputtering. All the high-performance window layers-obtained by sputtering have been films deposited by RF sputtering using a target of ZnO—Al or the like. However, the rate of film deposition by RF sputtering is low and is almost the same as that by MOCVD.

Features of DC magnetron sputtering are shown below.
The advantages thereof include the following.
(1) Since DC magnetron sputtering is an established technique for forming a large-area thin film, it is advantageous in producing a large-area thin-film solar cell.
(2) High-speed formation of a transparent conductive film is possible, and a high production efficiency is attainable in industrial production.
(3) Resistivity can be regulated by regulating the content of an alloying element, e.g., aluminum, in a ZnO target, so that it is possible to form a transparent conductive ZnO film having a thickness reduced to ½ to ⅔ of those of the transparent conductive ZnO films formed by MOCVD.
(4) Since a transparent conductive film can be formed in a short time period, the substrate is less apt to suffer deformation by thermal stress, and the film peeling caused by substrate deformation is less apt to occur. Further, the substrate need not be heated. Accordingly, it is possible to deposit transparent conductive ZnO films without heating a substrate.
(5) A homogeneous film can be deposited from the initial stage of the formation of a transparent conductive ZnO film.
(6) It is possible to deposit a transparent conductive ZnO film having a regulated resistivity value by utilizing a reactive sputtering method using a target of zinc metal or a target of an alloy of zinc with aluminum or any of other various dopants (boron, indium, etc.) and using an oxygen mixture gas.

The disadvantages of DC magnetron sputtering include the following.
(1) Formation of a transparent conductive ZnO film comparable in performance to those formed by MOCVD is difficult with any known DC magnetron sputtering technique.
(2) DC magnetron sputtering uses a higher energy density than RF sputtering, so that the junction interface or the light absorbing layer surface is apt to be damaged.
(3) Since the concentration of an alloying element for resistance regulation in the target is constant throughout the target, resistivity cannot be freely regulated. (However, resistivity regulation in a narrow range is possible by incorporating oxygen into the sputtering gas.) In order to reduce the resistivity increasing the concentration of an alloying element in the target, the transparency of a ZnO film is significantly degraded and functionally insufficient as a window layer of a CIGS thin-film solar cell.
(4) It is impossible to form a transparent conductive film having a surface texture with controlled roughness when the sputtering is conducted at a substrate temperature within the range in which a high-performance CIGS thin-film solar cell can be produced.

In FIGS. 3(a) and (b) are shown the results of a comparison in cell properties between solar cells employing a transparent conductive ZnO film formed by DC magnetron sputtering (indicated by the symbol ) and solar cells employing a transparent conductive ZnO film formed by MOCVD (indicated by the symbol ).

Whether a transparent conductive ZnO film is satisfactory or not can be judged by evaluating, among various solar cell properties, the series resistance of the film itself based on short-circuit current density ($J_{sc}$) and by evaluating the influence of the light absorbing layer surface or junction interface on the junction characteristics of the interface based on the fill factor (FF), which is a measure of interfacial junction characteristics in solar cells.

From the results given in FIGS. 3(a) and (b), it was found that the solar cells employing a transparent conductive ZnO film formed by DC magnetron sputtering had lower values of both short-circuit current density ($J_{sc}$) and fill factor (FF). It should be noted that the above transparent conductive ZnO film is one formed by DC magnetron sputtering using a single ZnO-Al target and is a film for use as a single-layer window layer.

The above results show-that since the single-layer transparent conductive ZnO film formed by DC magnetron sputtering has a high content of components which contribute to the series resistance of the film, the short-circuit current density (Jhd sc) and fill factor (FF) and low. Due to the plasma damage by DC magnetron sputtering, the junction characteristics are impaired. Namely, since DC magnetron sputtering uses a high energy density, it has drawbacks that the transparent conductive film formed has a high content of components contributing to recombination and that there is a fear of causing damage to the junction interface or to the light absorbing layer surface, although the sputtering technique is capable of high-speed film formation.

SUMMARY OF THE INVENTION

The present invention has been achieved in order to eliminate the problems described above. An object of the present invention is to form, at a high rate, a large-area transparent conductive ZnO film equal in performance to the transparent conductive ZnO film formed by MOCVD, while diminishing the influence of sputtering bombardment.

The present invention provides:

transparent conductive films of a thin-film solar cell comprising a metal back electrode layer having formed thereon in this order a CIGS (copper indium gallium diselenide) light absorbing layer (p-type), an interfacial layer (buffer layer), a window layer (n-type), and an upper electrode, the window layer being constituted of the transparent conductive films, which have a stacked structure comprising a first transparent conductive film formed on the interfacial layer and functioning as an interface-protective film, a second transparent conductive film formed on the first transparent conductive film, and a third transparent conductive film formed on the second transparent conductive film;

the transparent conductive films of a thin-film solar cell as described above, wherein the first transparent conductive film comprises intrinsic ZnO and has a thickness of 50 nm or smaller;

the transparent conductive films of a thin-film solar cell as described above, wherein the second transparent conductive film and the third transparent conductive film each comprises aluminum doped ZnO;

a method for producing transparent conductive films of a thin-film solar cell comprising a metal back electrode layer having formed thereon in this order a CIGS light absorbing layer (p-type), an interfacial layer (buffer layer), a window layer (n-type), and an upper electrode, the method comprising the steps of: forming a first transparent conductive film (functioning as an interface-protective film) on the interfacial layer by RF magnetron sputtering; forming a second transparent conductive film on the first transparent conductive film by DC magnetron sputtering; and forming a third transparent conductive film on the second transparent conductive film by DC magnetron sputtering;

the method for producing transparent conductive films of a thin-film solar cell as described above, wherein the RF magnetron sputtering is conducted using a ZnO target at a low output to form a transparent conductive ZnO film; and the method for producing transparent conductive films of a thin-film solar cell as described above, wherein the DC magnetron sputtering is conducted using a ZnO—Al target to form a transparent conductive ZnO—Al film.

DETAILED DESCRIPTION OF THE INVENTION

Modes for carrying out the present invention are explained below by reference to the drawings.

The present invention relates to transparent conductive films for use as a window layer in a thin-film solar cell of the type described above, and to a method for producing the transparent conductive films.

Figure 1:
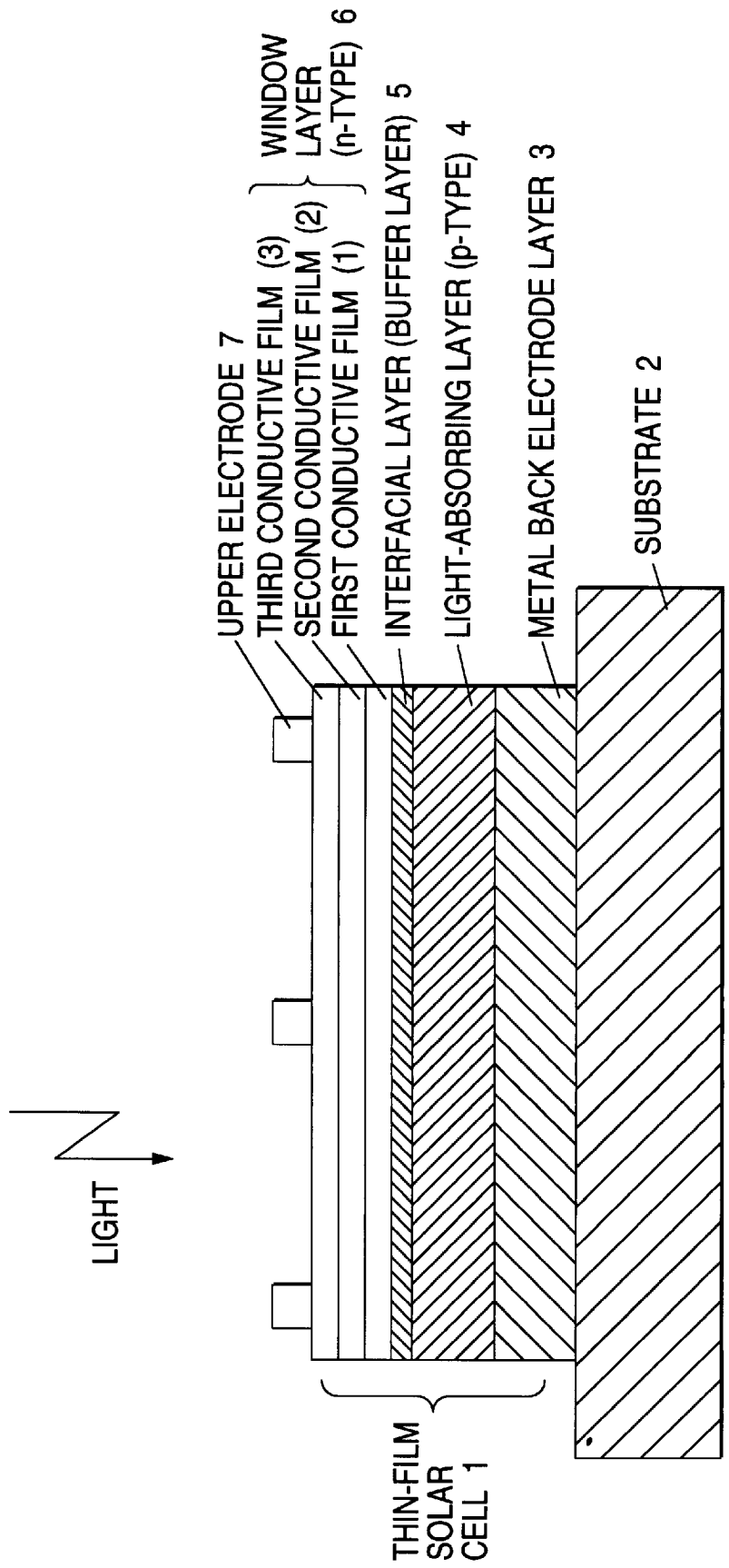
FIG. 1 is a diagrammatic view illustrating the constitution of a CIGS thin-film solar cell employing transparent conductive ZnO films formed by the method of the present invention.

FIG. 1 is a diagrammatic view illustrating the constitution of a CIGS thin-film solar cell employing transparent conductive films according to the present invention. This thin-film solar cell 1 is a stacked structure fabricated on a substrate 2. The stacked structure is constituted of a metal back-electrode layer 3, a CIGS light absorbing layer (p-type semiconductor) 4, a buffer layer (interfacial layer) 5, a window layer 6, and an upper electrode 7 disposed in this order on the substrate 2, and is characterized by the window layer 6, which consists of the transparent conductive films. Specifically, the window layer 6 has a stacked-structure consisting of a first transparent conductive film (1) formed on the interfacial layer 5 and functioning as a surface-protective layer, a second transparent conductive film (2) formed on the first transparent conductive film (1), and a third transparent conductive film (3) formed on the second transparent conductive film (2).

In the CIGS thin-film solar cell employing transparent conductive films according to the present invention, the metal back electrode layer, the CIGS light absorbing layer, the buffer layer, and the window layer each have a film thickness of from 5,000 to 15,000 Å, from 10,000 to 30,000 Å, from 100 to 1,000 Å, and from 5,000 to 20,000 Å, respectively.

Figure 2:
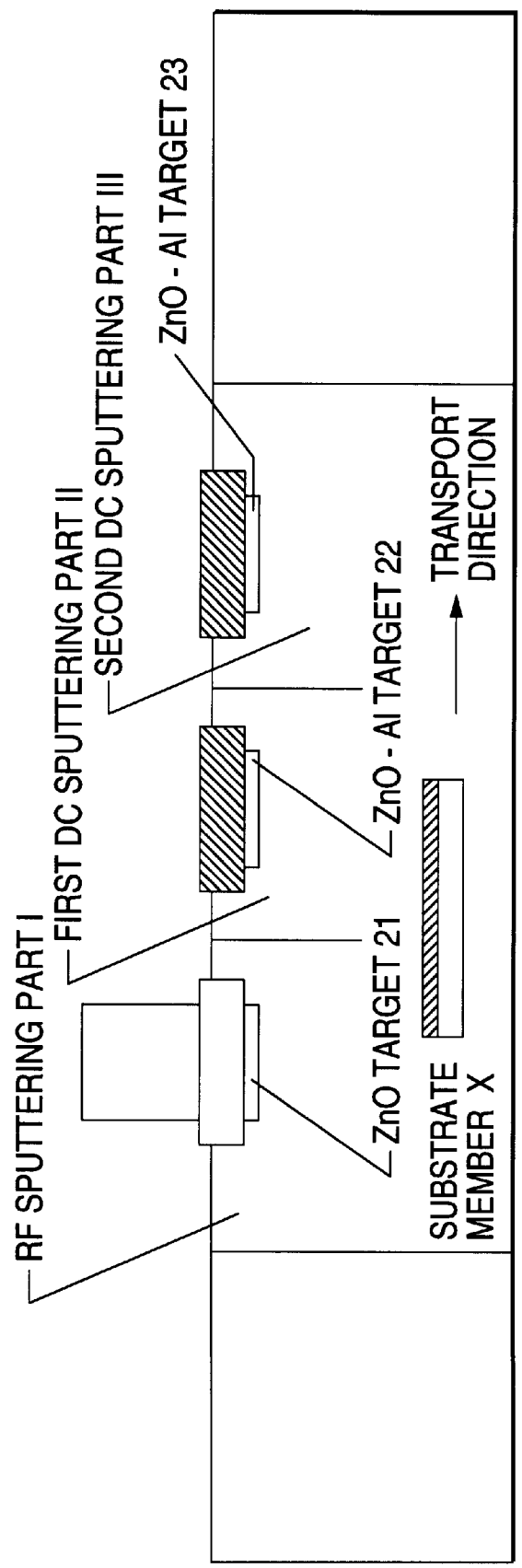
FIG. 2 is a diagrammatic view illustrating the constitution of an apparatus for use in practicing the method of the present invention.
Figure 3:
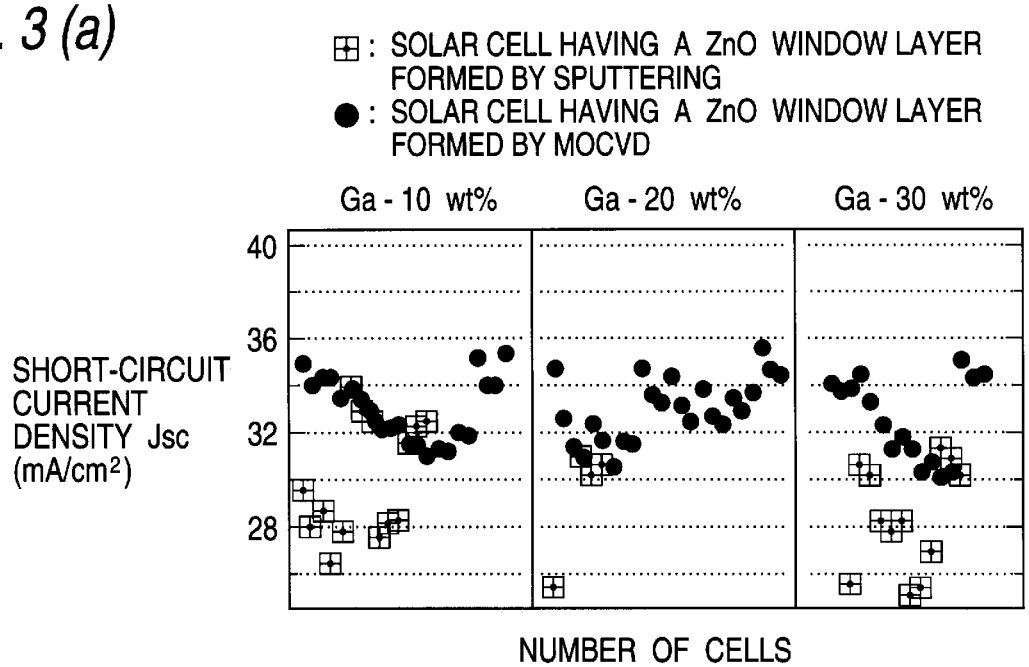
FIGS. 3(a) and 3(b) are graphical presentation illustrating a comparison in cell properties between solar cells employing transparent conductive ZnO films formed by DC magnetron sputtering and solar cells employing a transparent conductive ZnO film formed by MOCVD; "(a)" shows a comparison in short-circuit current density $J_{sc}$, and "(b)" shows a comparison in fill factor FF.
Figure 3:
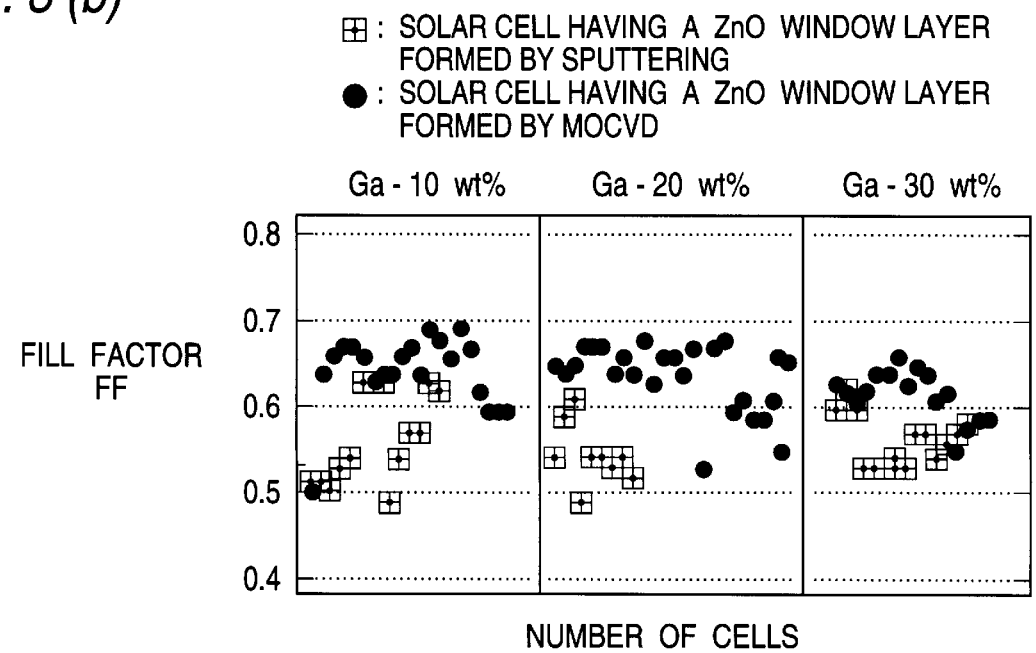

FIG. 2 diagrammatically shows the constitution of an apparatus for use in practicing the method of the present invention.

This apparatus comprises an RF sputtering part I, a DC sputtering part II, another DC sputtering part III, and a transport means (not shown) for transporting the substrate member X described below, which is the material to be treated with sputtering, to these sputtering parts.

The method of the present invention is explained below by reference to FIGS. 1 and 2.

Prior to the formation of a transparent conductive ZnO film with the apparatus shown in FIG. 2, a structure (the hatched part in FIG. 1) comprising a substrate 2 having formed thereon a metal back electrode layer 3, a CIGS light absorbing layer (p-type semiconductor) 4, and a buffer layer (interfacial layer) 5 is prepared (this structure is hereinafter referred to as "substrate member X").

In the first step of the method, the substrate member X is introduced into the apparatus and transported to the RF sputtering part I thereof, where RF sputtering is conducted using a ZnO target 21 at a low output of 100 W or below. Thus, a first conductive film (1) having a thickness of 50 nm or smaller and functioning as an interface-protective film is formed on the high-resistance buffer (interfacial) layer 5 of the substrate member X. Since this RF sputtering is conducted at a low output, the influence of sputtering bombardment is slight.

Subsequently, the substrate member X is transported to the first DC sputtering part II in the apparatus, where DC sputtering is conducted using a ZnO-2 wt % Al target 22. Thus, a second conductive film (2) is formed on the first conductive film (1) on the substrate member X.

Thereafter, the substrate member X is transported to the second DC sputtering part III of the apparatus, where DC sputtering is conducted using a ZnO-2 wt % Al target 23. Thus, a third conductive film (3) is formed on the second conductive film (2) on the substrate member X.

As described above, the formation of transparent conductive ZnO films in the method of the present invention is characterized in that RF sputtering and DC sputtering are used in combination, and that the DC sputtering is conducted in two steps (namely, the first DC sputtering part II and the second DC sputtering part III) to treat the substrate member X with DC magnetron sputtering using a ZnO-2 wt % Al target in each step to thereby form second and third conductive films (2) and (3). Due to this constitution, each sputtering step can be carried out at a reduced output per target in order to match the total thickness of a single layer ZnO:Al film obtained by DC magnetron sputtering and, as a result, the influence of sputtering bombardment is reduced.

In the RF sputtering part I, first DC sputtering part II, and second DC sputtering part III, the transport speed of the substrate member X is regulated according to the intended thicknesses of the conductive films (1), (2), and (3) to be formed in the respective sputtering parts. Specifically, the transparent conductive film (1) formed by the RF sputtering has a film thickness of 500 Å or less and a sheet resistance of 100 Ω/□ or higher, and the transparent conductive films (2) and (3) formed by the DC sputtering each has a film thickness of 3,000 to 6,000 Å. The film thickness of (2) has to be the same as that of (3) and the total thickness of the films formed by the DC sputtering should then be in the range of from 5,000 to 12,000 Å. The sheet resistance of the films formed by the DC sputtering is desirably 20 Ω/□ or lower.

Although DC sputtering was conducted in two steps in the embodiment described above, the number of DC sputtering steps may be increased or reduced if desired.

When the number of DC sputtering steps is increased such as two steps, the sputtering power per step can be reduced as compared to the single DC sputtering, and as a result, the junction interface or the light absorbing layer surface can be prevented from damaging by plasma. Further, a light trapping effect by increasing the number of sputtering steps is expected.

In the present invention, the RF sputtering is conducted under the following conditions that:

Set power: 10–100 W;

Gas pressure: 1–10 mTorr;

Target composition: ZnO; and

Transport speed: 1–15 cm/min.

In the present invention, the DC sputtering is conducted under the following conditions that:

Power density: 0.5–2.0 kW (current value 2A);

Gas pressure: 1–10 mTorr; and

Target composition: ZnO:Al (Al concentration 1–3 wt %, preferably Al 2 wt %).

The ZnO window layer 6 formed by sputtering was obtained in two steps by forming a first conductive film (1) by RF sputtering and then forming a second conductive film (2) by DC magnetron sputtering. The conditions shown in Table 1 were used.

TABLE 1

| Layer number | Method of film formation | Output (W) | Sputtering gas pressure (mTorr) | Transport speed (cm/min) |
|---|---|---|---|---|
| 1 | RF sputtering | 10–20 | 1 | 6 |
| 2 | DC sputtering | 2000 | | |

Figure 4:
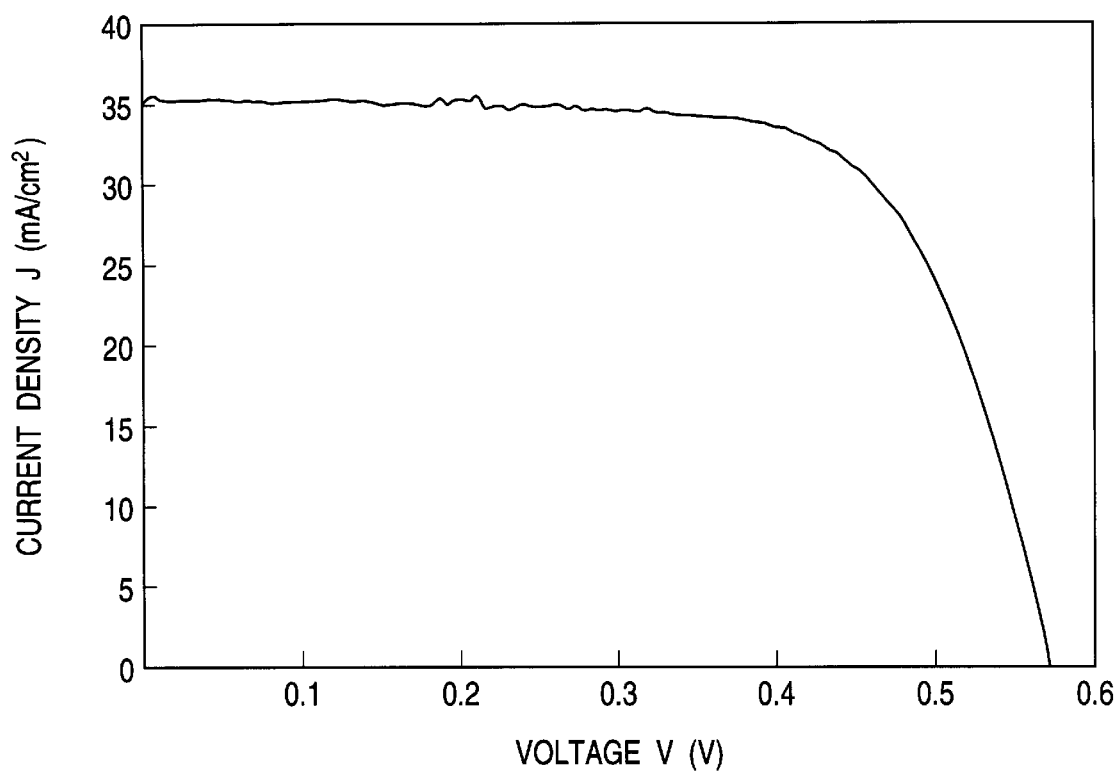
FIG. 4 is a graphical presentation illustrating output characteristic (J-V characteristic) of a CIGS thin-film solar cell employing transparent conductive ZnO films formed in an embodiment of the present invention under the conditions shown in Table 3, wherein reference numeral 1 designates thin-film solar cell, 2 substrate, 3 metal back electrode layer, 4 CIGS light absorbing layer (p-type), 5 interfacial layer (buffer layer), 6 window layer (n-type), (1) first conductive film (interface-protective film), (2) second conductive film, (3) third conductive film, 7 upper electrode, I RF sputtering part, II first DC sputtering part, III second DC sputtering part, and X substrate member.

Another solar cell was produced by a method in which a CIGS light absorbing layer 4 was formed using a gallium-20 wt % target (Cu 80%, Ga 20%) and a window layer 6 was formed in three steps by forming a first conductive film (1) by RF sputtering and then forming a second conductive film (2) and a third conductive film (3) by DC magnetron sputtering. The relationship between voltage (V) and current density J (mA/cm$^2$) in this solar cell is shown in FIG. 4.

The conditions used for forming the films (1) to (3) are shown in Table 2.

TABLE 2

| Layer number | Method of film formation | Output (W) | Sputtering gas pressure (mTorr) | Transport speed (cm/min) |
|---|---|---|---|---|
| 1 | RF sputtering | 10–20 | 1 | 6 |
| 2 | DC sputtering | 1100 | | |
| 3 | DC sputtering | 1100 | | |

From the properties shown in FIG. 4 of the solar cell employing transparent conductive ZnO films, the following results were obtained:

conversion efficiency $E_{FF}$, 14.1 (%); short-circuit current density $J_{sc}$, 35.2 (mA/cm$^2$); open-circuit voltage $V_{oc}$, 0.57 (V); and fill factor FF, 0.70.

The above solar cell employing transparent conductive ZnO films formed by sputtering according to the present invention attained a conversion efficiency $E_{FF}$ of 14.1 (%), which was almost the same as those of the solar cells employing a transparent conductive ZnO film formed by MOCVD.

As demonstrated above, transparent conductive ZnO films which are equal in performance to those formed by MOCVD and have a large area can be produced at a high rate while reducing the influence of sputtering bombardment, by first forming a part of the transparent conductive ZnO films by low-output RF magnetron sputtering and then forming the remaining part of the films in two or more steps by DC magnetron sputtering.

While the invention has been described in detail and with reference to specific embodiments thereof, it will be apparent to one skilled in the art that various changes and modifications can be made therein without departing from the spirit and scope thereof.

What is claimed is:

1. A thin-film solar cell comprising a metal back electrode layer having formed thereon in this order a p-type CIGS light absorbing layer, an interfacial layer, an n-type window layer, and an upper electrode, wherein the n-type window layer comprises transparent conductive films which have a stacked structure comprising a first transparent conductive film formed on the interfacial layer and serving as an interface-protective film, a second transparent conductive film formed on the first transparent conductive film, and a third transparent conductive film formed on the second transparent conductive film.

2. The thin-film solar cell as claimed in claim 1, wherein the first transparent conductive film comprises intrinsic ZnO and has a thickness of 50 nm or smaller.

3. The thin-film solar cell as claimed in claim 1, wherein the second transparent conductive film and the third transparent conductive film each comprises aluminum doped ZnO.

4. A method for producing transparent conductive films for a thin-film solar cell comprising a metal back electrode layer having formed thereon in this order a p-type CIGS light absorbing layer, an interfacial layer, an n-type window layer, and an upper electrode, wherein said n-type window layer is formed by a method comprising the steps of: forming a first transparent conductive film on the interfacial layer by RF magnetron sputtering to serve as an interface-protective film; forming a second transparent conductive film on the first transparent conductive film by DC magnetron sputtering; and forming a third transparent conductive film on the second transparent conductive film by DC magnetron sputtering.

5. The method for producing transparent conductive films for a thin-film solar cell as claimed in claim 4, wherein the RF magnetron sputtering is conducted using a ZnO target at an output of 100 W or lower to form a transparent conductive ZnO film.

6. The method for producing transparent conductive films for a thin-film solar cell as claimed in claim 4, wherein the DC magnetron sputtering is conducted using a ZnO—Al target to form a transparent conductive ZnO—Al film.

* * * * *